(12) United States Patent
Sano et al.

(10) Patent No.: US 8,593,223 B2
(45) Date of Patent: Nov. 26, 2013

(54) AUTOMATIC GAIN CONTROL CIRCUIT

(75) Inventors: Kimikazu Sano, Kanagawa (JP);
Hiroyuki Fukuyama, Kanagawa (JP);
Hideyuki Nosaka, Kanagawa (JP);
Makoto Nakamura, Kanagawa (JP);
Koichi Murata, Kanagawa (JP);
Masatoshi Tobayashi, Kanagawa (JP);
Yasunobu Inabe, Kanagawa (JP);
Eisuke Tsuchiya, Kanagawa (JP)

(73) Assignees: Nippon Telegraph and Telephone Corporation, Tokyo (JP); NTT Electronics Corporation, Kanagawa (JP)

( * ) Notice: Subject to any disclaimer, the term of this patent is extended or adjusted under 35 U.S.C. 154(b) by 11 days.

(21) Appl. No.: 13/527,512

(22) Filed: Jun. 19, 2012

(65) Prior Publication Data

US 2012/0326782 A1    Dec. 27, 2012

(30) Foreign Application Priority Data

Jun. 21, 2011  (JP) .................................. 2011-137143

(51) Int. Cl.
*H03G 3/10*          (2006.01)

(52) U.S. Cl.
USPC .......................................... 330/279; 330/285

(58) Field of Classification Search
USPC ........................................ 330/279, 285, 296
See application file for complete search history.

(56) References Cited

U.S. PATENT DOCUMENTS

| 6,160,449 | A  | * | 12/2000 | Klomsdorf et al. ........... | 330/149 |
| 7,724,090 | B2 | * | 5/2010  | Lin et al. ..................... | 330/279 |
| 8,138,831 | B2 | * | 3/2012  | Smith .......................... | 330/140 |
| 8,228,121 | B2 | * | 7/2012  | Benhamouda et al. ....... | 330/279 |

FOREIGN PATENT DOCUMENTS

| JP | 08-288757   | 11/1996 |
| JP | 10-190375   | 7/1998  |
| JP | 11-027216   | 1/1999  |
| JP | 11-168335   | 6/1999  |
| JP | 2009-260715 | 11/2009 |

OTHER PUBLICATIONS

Sano et al., "A Wideband Low-distorted ROSA for Video Distribution Service based on FM Conversion Sheme", ECOC 2007 Proceedings, vol. 3, pp. 167-168, 2007.
Gray et al., "Analysis and Design of Analog Integrated Circuits (lower volume)", Fourth Edition, BAIHUKAN, pp. 263-264, 2003.

\* cited by examiner

*Primary Examiner* — Henry Choe
(74) *Attorney, Agent, or Firm* — Blakely Sokoloff Taylor & Zafman

(57) ABSTRACT

In an automatic gain control circuit, a peak detection circuit detects and outputs the peak voltage of an output signal from a variable gain circuit. An average value detection/output amplitude setting circuit detects the average value voltage of an output signal from the variable gain circuit, and outputs a calculated voltage. An amplification circuit controls the gain of the variable gain circuit by amplifying the difference between the output voltages of the peak detection circuit and average value detection/output amplitude setting circuit. The number of base-emitter junctions of transistors on a path in the peak detection circuit from input ports which receive output signals from the variable gain circuit to an output port which outputs a voltage to the amplification circuit is equal to the number of base-emitter junctions of transistors on a path in the average value detection/output amplitude setting circuit.

4 Claims, 5 Drawing Sheets

AUTOMATIC GAIN CONTROL CIRCUIT

BACKGROUND OF THE INVENTION

The present invention relates to an automatic gain control circuit which automatically controls the gain of a variable gain circuit in a semiconductor integrated circuit.

Conventionally, an automatic gain control circuit has been used as a constituent element of a transimpedance amplification circuit which simultaneously converts and amplifies a micro-photocurrent into a voltage signal. FIG. 4 shows the arrangement of a transimpedance amplification circuit disclosed in non-patent literature 1 (Kimikazu Sano, et al., "A Wideband Low-distorted ROSA for Video Distribution Service based on FM Conversion Scheme", ECOC 2007 Proceedings, Vol. 3, pp. 167-168, 2007).

A transimpedance core circuit 1 converts the current signal obtained by a light-receiving element such as a photodiode (not shown) into a voltage signal. An offset compensation circuit 2 compensates for the offset of an output signal from the transimpedance core circuit 1. A variable gain circuit (variable gain amplifier) 3 amplifies an output signal from the transimpedance core circuit 1. The variable gain circuit 3 outputs an output signal to differential output ports OT and OC via an output buffer 4. An automatic gain control circuit 5 controls the gain of the variable gain circuit 3 by generating a gain control signal to match the amplitude of an output signal from the variable gain circuit 3 with a predetermined set output amplitude.

The automatic gain control circuit 5 will be described in detail below. The automatic gain control circuit 5 includes a peak detection circuit 50, an average value detection circuit 51, an output amplitude setting circuit 52, an operational amplifier 53, resistors r51, r52, r53, and r54, and capacitors c51, c52, and c53. The peak detection circuit 50 detects a peak value THo of an output signal from the variable gain circuit 3. The average value detection circuit 51 detects an average value Ave of the output signal from the variable gain circuit 3. The difference between the peak value THo and the average value Ave is a half value (half amplitude) of the output signal from the variable gain circuit 3. A set output half amplitude ASet as a reference is set in the output amplitude setting circuit 52. The output amplitude setting circuit 52 outputs the set output half amplitude ASet between the non-inverting input port and inverting input port of the operational amplifier 53.

The operational amplifier 53 adds, at its input, the output amplitude of the variable gain circuit 3 to the set output half amplitude ASet output from the output amplitude setting circuit 52 as indicated by $$Ave-Tho+ASet \quad (1)$$

Since the input of the operational amplifier 53 is almost 0 during stable operation because of the high gain characteristics of the operational amplifier itself, the value of mathematical expression (1) becomes almost 0. As a consequence, mathematical expression (2) holds:

$$THo-Ave \approx ASet \quad (2)$$

That is, the operational amplifier 53 amplifies the difference between the set output half amplitude ASet and the output half amplitude (THo−Ave) of the variable gain circuit 3, and outputs a gain control signal to the variable gain circuit 3 based on the amplification result. With this operation, the operational amplifier 53 controls the gain of the variable gain circuit 3 so as to stabilize the output half amplitude (THo−Ave) of the variable gain circuit 3 at the set output half amplitude ASet.

For example, a Gilbert-cell type variable gain circuit (see non-patent literature 2) is used as the variable gain circuit 3. FIG. 5 shows the arrangement of the Gilbert-cell type variable gain circuit disclosed in literature 2 (P. R. Gray, P. J. Hurst, S. H. Lewis, and R. G. Meyer (Kunihiro Asada and Yuzuru Nagata: Supervisors of Translation), "Analysis and Design of Analog Integrated Circuits (lower volume))", Fourth Edition, BAIHUKAN, pp. 263-264, 2003).

This variable gain circuit includes amplitude adjustment transistors Q30 and Q31 constituting an upper differential pair which performs output amplitude adjustment in accordance with gain control signals GCT and GCC input to the bases, amplitude adjustment transistors Q32 and Q33 constituting the upper differential pair, amplification transistors Q34 and Q35 constituting a lower differential pair whose bases are connected to a positive-phase input port HIT and a reverse-phase input port HIC, a current source I30 having one port connected to the emitters of the amplification transistors Q34 and Q35, and the other port receiving a power supply voltage VEE, a collector resistor R30 having one port receiving a power supply voltage VCC, and the one port connected to the collectors of the amplitude adjustment transistors Q30 and Q32, and a collector R31 having one port receiving the power supply voltage VCC, and the other port connected to the collectors of the amplitude adjustment transistors Q31 and Q33. The collector of the amplification transistor Q34 is connected to the emitters of the amplitude adjustment transistors Q30 and Q31. The collector of the amplification transistor Q35 is connected to the emitters of the amplitude adjustment transistors Q32 and Q33.

In the variable gain circuit shown in FIG. 5, a positive-phase input signal and a reverse-phase input signal output from the transimpedance core circuit 1 are respectively input to the positive-phase input port HIT and the reverse-phase input port HIC, the gain control signals GCT and GCC are respectively input to the amplitude adjustment transistors Q30 and Q31, and the gain control signals GCT and GCC are respectively input to the amplitude adjustment transistors Q33 and Q32 constituting the upper differential pair. The node of the collectors of the amplitude adjustment transistors Q31 and Q33 and the collector R31 is connected to a positive-phase output port HOT. The node of the collectors of the amplitude adjustment transistors Q30 and Q32 and the collector resistor R30 is connected to a reverse-phase output port HOC.

The output amplitude value of the variable gain circuit 3 which is controlled by the automatic gain control circuit 5 shown in FIG. 4 so as to be constant sometimes greatly changes. The phenomenon in which the output amplitude value of the variable gain circuit 3 changes with temperature can occur when the output voltage THo of the peak detection circuit 50 in FIG. 4 and the average voltage Ave of the average value detection circuit 51 differ in temperature dependence. This can be understood from mathematical expression (2).

The automatic gain control circuit 5 detects the difference (THo−Ave) between the output voltage THo of the peak detection circuit 50 and the output voltage Ave of the average value detection circuit 51. The automatic gain control circuit 5 also compares the output voltage difference (THo−Ave) with the output voltage ASet of the output amplitude setting circuit 52, and operates to set the difference to 0. In this case, if the output voltage THo of the peak detection circuit 50 and the output voltage Ave of the average value detection circuit 51 differ in temperature dependence, the output voltage difference (THo−Ave) becomes temperature dependent.

Since the output voltage difference (THo−Ave) as one of comparison determination signals used by the automatic gain control circuit 5 to generate gain control signals has temperature dependence, the gain control signal output from the automatic gain control circuit 5 to the variable gain circuit 3 becomes temperature dependent. As a result, an output amplitude value from the variable gain circuit 3 also becomes temperature dependent. As described above, according to the related art, since the output amplitude of the variable gain circuit 3 inevitably has temperature dependence, a large circuit operation margin is set.

SUMMARY OF THE INVENTION

The present invention has been made to solve the above problem and has as its object to reduce the temperature dependence of the gain control signal generated by an automatic gain control circuit and therefore reduce the temperature dependence of the output amplitude of a variable gain circuit.

According to the present invention, there is provided an automatic gain control circuit comprising a peak detection circuit which detects and outputs a peak voltage of an output signal from a variable gain circuit which amplifies a main signal, and includes transistors, an average value detection and output amplitude setting circuit (hereinafter referred to as an "average value detection/output amplitude setting circuit") which detects an average value voltage of an output signal from the variable gain circuit, outputs a voltage obtained by adding a voltage with an amplitude ½ a desired output amplitude of the variable gain circuit to the average value voltage, and includes transistors, and an amplification circuit which controls a gain of the variable gain circuit by amplifying a difference between an output voltage of the peak detection circuit and an output voltage of the average value detection/output amplitude setting circuit and outputting the amplification result as a gain control signal to the variable gain circuit, wherein the number of base-emitter junctions of transistors on a path in the peak detection circuit from input ports which receive output signals from the variable gain circuit to an output port which outputs a voltage to the amplification circuit is equal to the number of base-emitter junctions of transistors on a path in the average value detection/output amplitude setting circuit from input ports which receive output signals from the variable gain circuit to an output port which outputs a voltage to the amplification circuit.

DESCRIPTION OF THE PREFERRED EMBODIMENTS

The embodiments of the present invention will be described below with reference to the accompanying drawings.

First Embodiment

Figure 1:
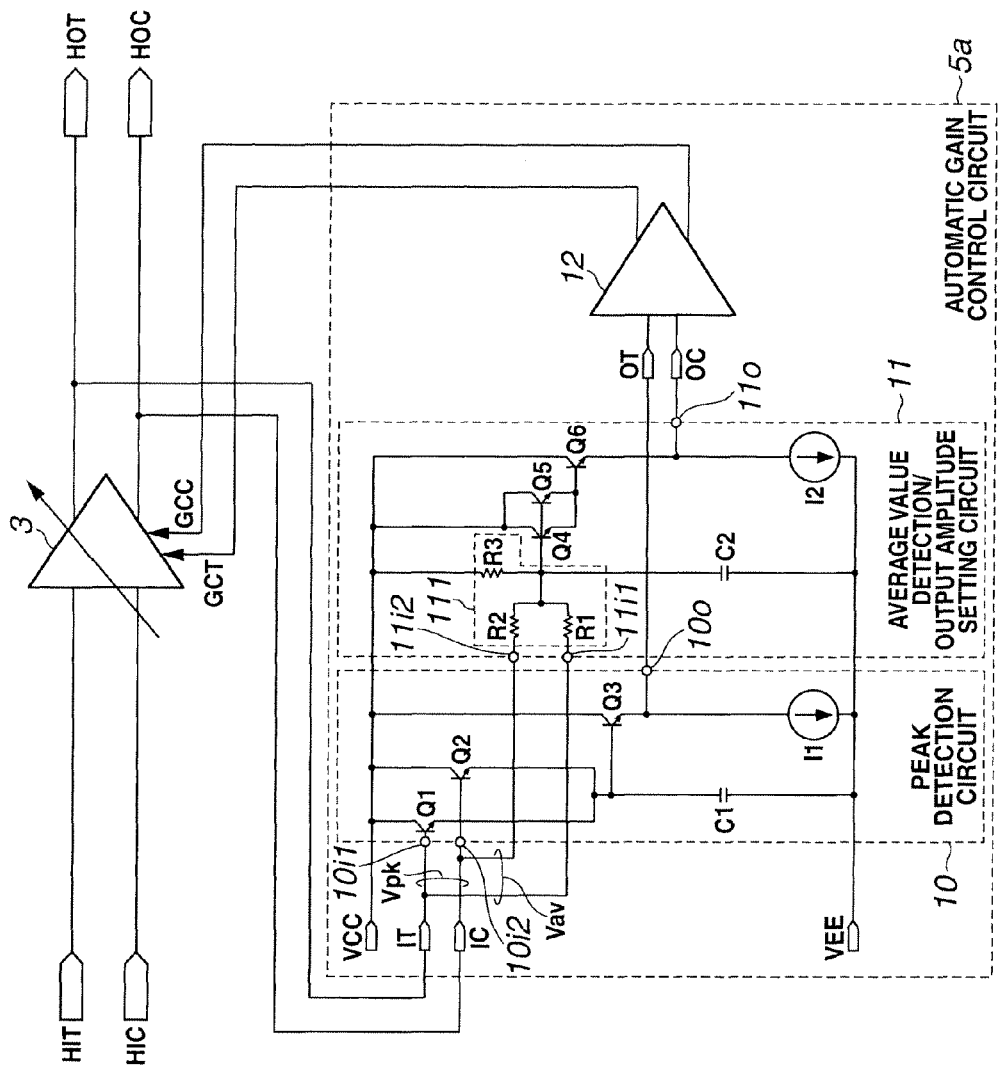
FIG. 1 is a circuit diagram showing the arrangement of an automatic gain control circuit according to the first embodiment of the present invention.
Figure 4:
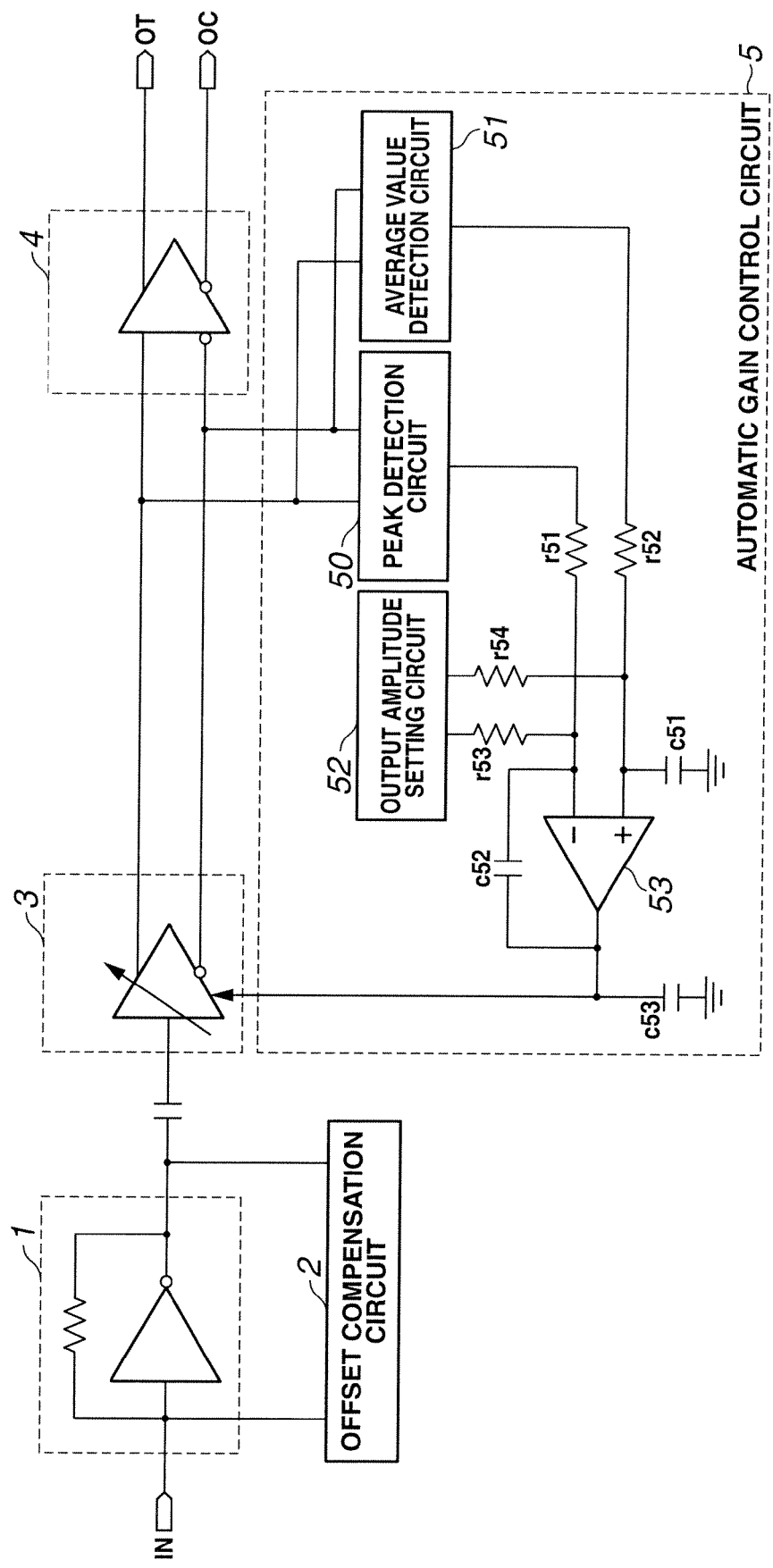
FIG. 4 is a block diagram showing the arrangement of a conventional transimpedance amplification circuit.

Like the conventional automatic gain control circuit 5 shown in FIG. 4, an automatic gain control circuit 5a shown in FIG. 1 generates and outputs a gain control signal to a variable gain circuit 3, which amplifies a main signal, so as to set the output amplitude of the variable gain circuit 3 to the amplitude set by the automatic gain control circuit 5a, while monitoring the output amplitude.

The automatic gain control circuit 5a includes a peak detection circuit 10, an average value detection and output amplitude setting circuit (hereinafter referred to as an "average value detection/output amplitude setting circuit") 11, and a high gain amplifier 12 serving as a differential amplification circuit.

Like the conventional peak detection circuit 50 shown in FIG. 4, the peak detection circuit 10 is a circuit which detects and outputs the peak voltage of an output signal from the variable gain circuit 3. The peak detection circuit 10 includes a first transistor Q1, a second transistor Q2, a third transistor Q3, a first capacitor C1, and a first current source I1. The first transistor Q1 has a base connected to a positive-phase input port IT of the automatic gain control circuit 5a, and a collector receiving a first power supply voltage VCC. The second transistor Q2 has a base connected to a reverse-phase input port IC of the automatic gain control circuit 5a, and a collector receiving the power supply voltage VCC. The third transistor Q3 has a base connected to the emitters of the transistors Q1 and Q2, and a collector receiving the power supply voltage VCC. The capacitor C1 has one port connected to the emitters of the transistors Q1 and Q2 and the base of the transistor Q3, and the other port receiving a second power supply voltage VEE. The current source I1 has one port connected to the emitter of the transistor Q3, and the other port receiving the power supply voltage VEE. The current source I1 supplies a constant current to the transistor Q3. The base of the transistor Q1 serves as a first input port 10i1 of the peak detection circuit 10. The base of the transistor Q2 serves as a second input port 10i2 of the peak detection circuit 10. The emitter of the transistor Q3 serves as an output port 10o of the peak detection circuit 10. The other port of the capacitor C1 and the other port of the current source I1 may be grounded.

The average value detection/output amplitude setting circuit 11 is a circuit obtained by integrating an average value detection circuit with an output amplitude setting circuit which are separate in the conventional automatic gain control circuit 5 shown in FIG. 4. This circuit detects the average value voltage of an output signal from the variable gain circuit 3 and outputs a voltage obtained by adding a voltage (half amplitude) with an amplitude almost ½ a desired output amplitude of the variable gain circuit 3 to the average value voltage. The average value detection/output amplitude setting circuit 11 includes a fourth transistor Q4, a fifth transistor Q5, a sixth transistor Q6, a first resistor R1, a second resistor R2, a third resistor R3, a second capacitor C2, and a second current source I2. The power supply voltage VCC is applied to the collectors of the transistors Q4 and Q5. The transistor Q6 has a base connected to the emitters of the transistors Q4 and Q5, and a collector receiving the power supply voltage VCC. The resistor R1 has one port connected to the positive-phase input port IT of the automatic gain control circuit 5a, and the other port connected to the bases of the transistors Q4 and Q5. The resistor R2 has one port connected to the reverse-phase input port IC of the automatic gain control circuit 5a, and the other port connected to the bases of the transistors Q4 and Q5. The resistor R3 has one port receiving the power supply voltage VCC, and the other port connected to the bases of the transistors Q4 and Q5. The capacitor C2 has one port connected to the bases of the transistors Q4 and Q5, and the other port receiving the power supply voltage VEE. The current source I2 has one port connected to the emitter of the transistor Q6, and the other port receiving the power supply voltage VEE. The current source I2 supplies a constant current to the transistor Q6. One port of the resistor R1 serves as a first input port nil of the average value detection/output amplitude setting circuit 11. One port of the resistor R2 serves as a second input port 11i2 of the average value detection/output amplitude setting circuit 11. The emitter of the transistor Q6 serves as an output port 11o of the average value detection/output amplitude setting circuit 11. The other port of the capacitor C2 and the other port of the current source I2 may be grounded.

The resistors R1, R2, and R3 constitute a voltage detection/setting circuit 111. The voltage detection/setting circuit 111 has a function of adding a voltage with an amplitude almost ½ the desired output amplitude of the variable gain circuit 3 to the average value voltage of a voltage at the positive-phase input port IT and a voltage at the reverse-phase input port IC. The other port of the resistor R1 is connected to the other port of each of the resistors R2 and R3 to serve as the output port of the voltage detection/setting circuit 111.

The output port (the node of the emitter of the transistor Q3 and the current source I1) 10o of the peak detection circuit 10 is connected to a positive-phase input port OT of the high gain amplifier 12. The output port (the node of the emitter of the transistor Q6 and the current source I2) 11o of the average value detection/output amplitude setting circuit 11 is connected to a reverse-phase input port OC of the high gain amplifier 12.

Figure 5:
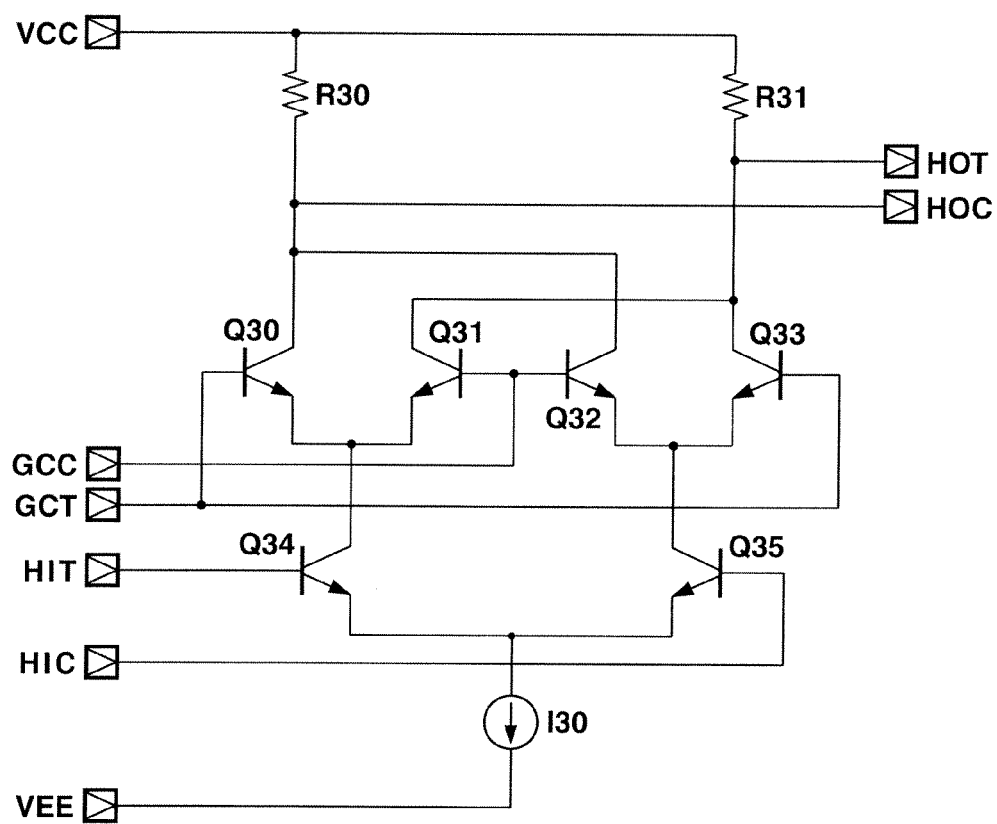
FIG. 5 is a circuit diagram showing the arrangement of a Gilbert-cell type variable gain circuit.

The high gain amplifier 12 has the same function as that of the conventional operational amplifier 53 shown in FIG. 4. That is, the high gain amplifier 12 amplifies the difference between the output voltage of the peak detection circuit 10 and the output voltage of the average value detection/output amplitude setting circuit 11, and outputs the amplification result as a gain control signal to the variable gain circuit 3. With this operation, the high gain amplifier 12 controls the gain of the variable gain circuit 3 so as to match the output voltage of the peak detection circuit 10 with the output voltage of the average value detection/output amplitude setting circuit 11. As described above, as the variable gain circuit 3, for example, the Gilbert-cell type variable gain circuit shown in FIG. 5 is used.

A positive-phase output port HOT of the variable gain circuit 3 is connected to the positive-phase input port IT of the automatic gain control circuit 5a. The reverse-phase output port HOC of the variable gain circuit 3 is connected to the reverse-phase input port IC of the automatic gain control circuit 5a. In addition, a gain control signal GCT on the positive-phase side and a gain control signal GCC on the reverse-phase side which are output from the high gain amplifier 12 are input to the variable gain circuit 3.

The following will explain how this embodiment reduces the temperature dependence of the output amplitude value of the variable gain circuit 3, by using mathematical expressions.

First of all, this embodiment obtains a voltage at the positive-phase input port OT of the differential input ports OT and OC of the high gain amplifier 12. Letting Vpk be the peak value of the output voltage of the variable gain circuit 3, Vbe1 be the base-emitter voltage of the transistors Q1 and Q2, and Vbe2 be the base-emitter voltage of the transistor Q3, a voltage at the positive-phase input port OT is given by $$Vpk-Vbe1-Vbe2 \qquad (1)$$

The embodiment then obtains a voltage at the reverse-phase input port OC of the high gain amplifier 12. Letting Vav be the average value of the output voltage of the variable gain circuit 3, a voltage at the common node of the resistors R1, R2, and R3 (the common node of the bases of the transistors Q4 and Q5) is given by $$Vav+(VCC-Vav)\times\{(R1\times R2)/(R1+R2)\}/[\{(R1\times R2)/(R1+R2)\}+R3] \qquad (2)$$

If the following three conditions hold: (A) the size of the transistors Q1 and Q2 is equal to that of the transistors Q4 and Q5, (B) the size of the transistor Q3 is equal to that of the transistor Q6, and (C) the current value of the current source I1 is equal to that of the current source I2, the base current of the transistor Q3 is equal to that of the transistor Q6, and a current with a magnitude ½ that of these base currents flows in the emitters of the transistors Q1, Q2, Q4, and Q5 having the same size. As a consequence, the base-emitter voltage of the transistors Q4 and Q5 becomes equal to the base-emitter voltage Vbe1 of the transistors Q1 and Q2. In this case, that transistors have the same size means that the base-emitter voltages are the same under the condition of the same base current. One of the methods of implementing such transistors is to manufacture transistors which are to have the same size in such a manner that they have have the same semiconductor layer structure or electrode structure, and the semiconductor layers and electrodes have the same thickness and length.

If the two conditions described above hold: (B) the size of the transistor Q3 is equal to that of the transistor Q6 and (C) the current value of the current source I1 is equal to that of the current source I2, currents from the current sources I1 and I2 having the same current value respectively flow in the emitters of the transistors Q3 and Q6. As a consequence, the base-emitter voltage of the transistor Q6 becomes equal to the base-emitter voltage Vbe2 of the transistor Q3. According to the above description, a voltage at the reverse-phase input port OC is given by $$Vav+(VCC-Vav)\times\{(R1\times R2)/(R1+R2)\}/[\{(R1\times R2)/(R1+R2)\}+R3]-Vbe1-Vbe2 \qquad (3)$$

The positive-phase input port OT and the reverse-phase input port OC are the input ports of the high gain amplifier 12. As described above, the high gain amplifier 12 operates to match a voltage at the positive-phase input port OT with a voltage at the reverse-phase input port OC. Therefore, the following equation holds according to mathematical expressions (1) and (3)

$$Vpk-Vbe1-Vbe2=Vav+(VCC-Vav)\times\{(R1\times R2)/(R1+R2)\}/[\{(R1\times R2)/(R1+R2)\}+R3]-Vbe1-Vbe2 \qquad (4)$$

In addition, equation (4) can be arranged into $$Vpk-Vav=(VCC-Vav)\times\{(R1\times R2)/(R1+R2)\}/[\{(R1\times R2)/(R1+R2)\}+R3] \qquad (5)$$

That is, in this embodiment, the variable gain circuit 3 operates such that the difference between its peak voltage and an average value voltage becomes $(VCC-Vav) \times \{(R1 \times R2)/(R1+R2)\}/\{\{(R1 \times R2)/(R1+R2)\}+R3\}$. Therefore, the output amplitude of the variable gain circuit 3 is expressed by $$2 \times (VCC-Vav) \times \{(R1 \times R2)/(R1+R2)\}/[\{(R1 \times R2)/(R1+R2)\}+R3] \quad (6)$$

As is obvious, mathematical expression (6) includes neither the base-emitter voltage Vbe1 of the transistors Q1, Q2, Q4, and Q5 nor the base-emitter voltage Vbe2 of the transistors Q3 and Q6. The reason why the base-emitter voltages Vbe1 and Vbe2 are excluded can be explained as follows. The transistors in a two-stage form constituted by (Q1+Q2) and Q3 are inserted in the path from the input ports (the bases of the transistors Q1 and Q2) 10i1 and 10i2 of the peak detection circuit 10 to the output port 10o of the peak detection circuit 10. The transistors in a two-stage form constituted by (Q4+Q5) and Q6 are inserted in the path from the input ports (one port of each of the resistors R1 and R2) 11i1 and 11i2 of the average value detection/output amplitude setting circuit 11 to the output port 11o of the average value detection/output amplitude setting circuit 11. Therefore, the number of base-emitter junctions of the transistors on the path from the input ports 10i1 and 10i2 of the peak detection circuit 10 to the output port 10o is equal to that on the path from the input ports 11i1 and 11i2 to the output port 11o of the average value detection/output amplitude setting circuit 11. For this reason, when the high gain amplifier 12 generates a gain control signal from the difference between the output voltage of the peak detection circuit 10 and the output voltage of the average value detection/output amplitude setting circuit 11, the base-emitter voltages Vbe1 and Vbe2 are excluded.

The base-emitter voltages Vbe1 and Vbe2 have strong temperature dependence. For this reason, if mathematical expression (6) contains Vbe1 and Vbe2, the output amplitude of the variable gain circuit 3, which should be constant, greatly varies. This embodiment excludes Vbe1 and Vbe2 having strong temperature dependence from mathematical expression (6), which is the set value of the output amplitude of the variable gain circuit 3, to reduce the temperature dependence.

Note that the resistors R1 to R3 also have temperature dependence. However, the mathematical expression $\{(R1 \times R2)/(R1+R2)\}/[\{(R1 \times R2)/(R1+R2)\}+R3]$ in mathematical expression (6) which is associated with the resistors R1 to R3 is a mathematical expression for calculating a ratio. For this reason, using the same resistive material for the resistors R1 to R3 will cancel the temperature dependence of each resistor, thereby reducing the temperature dependence of $\{(R1 \times R2)/(R1+R2)\}/[\{(R1 \times R2)/(R1+R2)\}+R3]$. Therefore, this embodiment can reduce the temperature variation dependence of the output amplitude of the variable gain circuit 3 to about the temperature dependence of the power supply voltage VCC and the average value Vav of the output voltage of the variable gain circuit 3.

Furthermore, since the average value detection circuit and the output amplitude setting circuit are integrated, this embodiment can obtain effects such as a reduction in the number of elements used, a reduction in chip area, and a reduction in power consumption.

Second Embodiment

Figure 2:
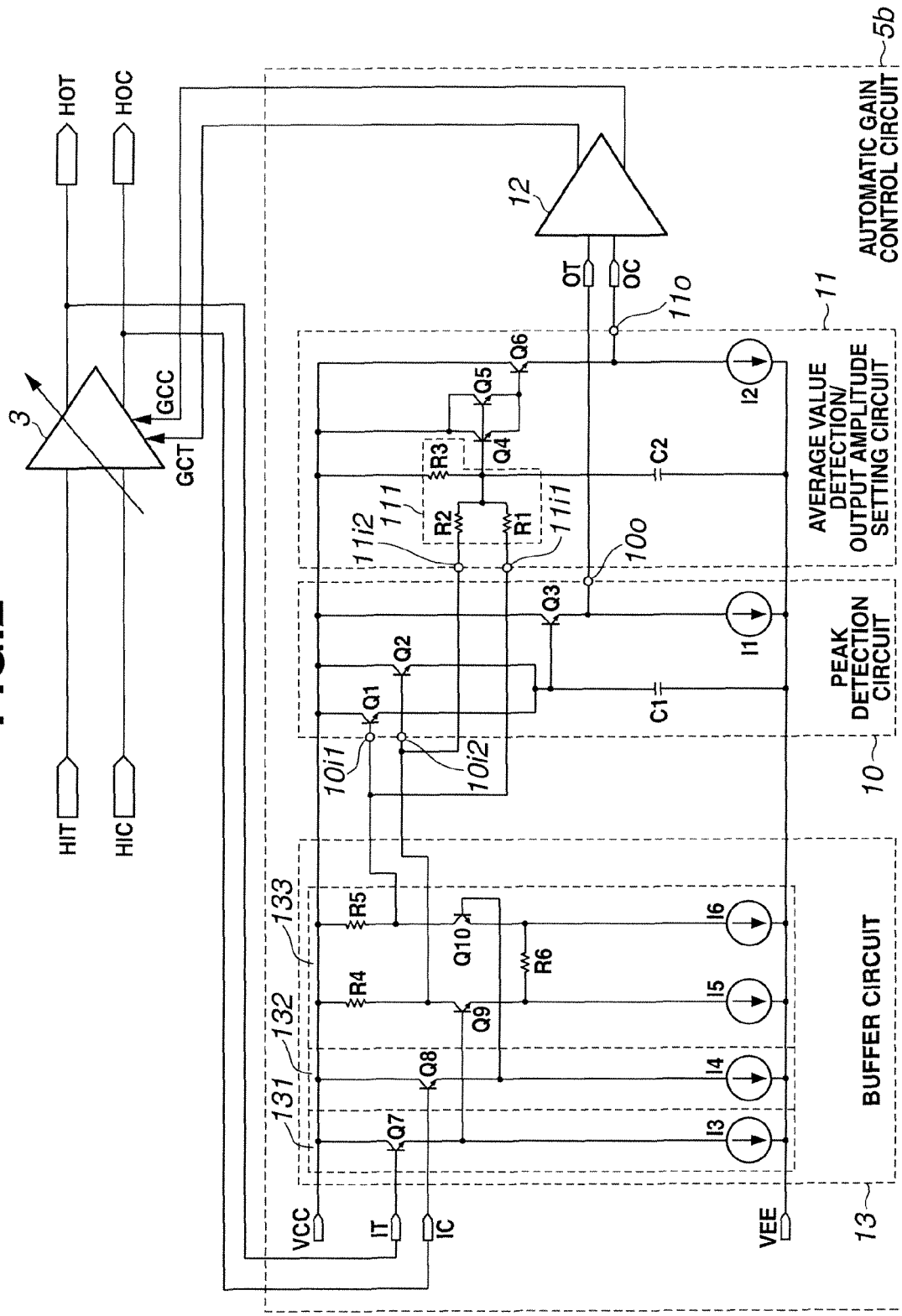
FIG. 2 is a circuit diagram showing the arrangement of an automatic gain control circuit according to the second embodiment of the present invention.

Like the conventional automatic gain control circuit 5 shown in FIG. 4 and the automatic gain control circuit 5a shown in FIG. 1, an automatic gain control circuit 5b shown in FIG. 2 generates and outputs a gain control signal to a variable gain circuit 3 so as to set the output amplitude of the variable gain circuit 3 to the amplitude set by the automatic gain control circuit 5b while monitoring the output amplitude.

The automatic gain control circuit 5b includes a peak detection circuit 10, an average value detection/output amplitude setting circuit 11, a high gain amplifier 12, and a buffer circuit 13. The automatic gain control circuit 5b differs from the automatic gain control circuit 5a shown in FIG. 1 in that the buffer circuit 13 is inserted between a positive-phase input port IT and a reverse-phase input port IC and input ports 10i1 and 10i2 of the peak detection circuit 10 and input ports 11i1 and 11i2 of the average value detection/output amplitude setting circuit 11.

The buffer circuit 13 includes a seventh transistor Q7, an eighth transistor Q8, a ninth transistor Q9, a 10th transistor Q10, a fourth resistor R4, a fifth resistor R5, a sixth resistor R6, a third current source I3, a fourth current source I4, a fifth current source I5, and a sixth current source I6. The transistor Q7 has a base connected to the positive-phase input port IT of the automatic gain control circuit 5b, and a collector receiving a power supply voltage VCC. The transistor Q8 has a base connected to the reverse-phase input port IC of the automatic gain control circuit 5b, and a collector receiving the power supply voltage VCC. The transistors Q9 and Q10 are transistors in a differential arrangement in which their bases are connected to the emitters of the transistors Q7 and Q8. The resistor R4 has one port receiving the power supply voltage VCC, and the other port connected to the collector of the transistor Q9. The resistor R5 has one port receiving the power supply voltage VCC, and the other port connected to the collector of the transistor Q10. The resistor R6 has one port connected to the emitter of the transistor Q9, and the other port connected to the emitter of the transistor Q10. The current source I3 has one port connected to the emitter of the transistor Q7, and the other port receiving a power supply voltage VEE. The current source I4 has one port connected to the emitter of the transistor Q8, and the other port receiving the power supply voltage VEE. The current source I5 has one port connected to the emitter of the transistor Q9, and the other port receiving the power supply voltage VEE. The current source I6 has one port connected to the emitter of the transistor Q10, and the other port receiving the power supply voltage VEE.

The transistor Q7 and the current source I3 constitute an emitter follower circuit 131. The transistor Q8 and the current source I4 constitute an emitter follower circuit 132. The bases of the transistors Q7 and Q8 serve as the input ports of the emitter follower circuits 131 and 132. The emitters of the transistors Q7 and Q8 serve as the output ports of the emitter follower circuits 131 and 132. The transistors Q9 and Q10, the resistors R4 and R5, and the current sources I5 and I6 constitute an output circuit (differential amplification circuit) 133. The bases of the transistors Q9 and Q10 serve as the input ports of the output circuit 133. The collectors of the transistors Q9 and Q10 serve as the output ports of the output circuit 133.

The positive-phase output port of the buffer circuit 13 (the node of the collector of the transistor Q10 and the resistor R5) is connected to the positive-phase input port of the peak detection circuit 10 (the base of the transistor Q1) and the positive-phase input port of the average value detection/output amplitude setting circuit 11 (one port of the resistor R1). The reverse-phase output port of the buffer circuit 13 (the node of the collector of the transistor Q9 and the resistor R4) is connected to the reverse-phase input port of the peak detection circuit 10 (the base of the transistor Q2) and the reverse-phase input port of the average value detection/output amplitude setting circuit 11 (one port of the resistor R2).

The buffer circuit 13 has a function of ensuring a larger band on the high-frequency side of the variable gain circuit 3 than in the first embodiment by reducing loads, especially capacitive loads, at differential output ports HOT and HOC of the variable gain circuit 3 as compared with the first embodiment. The manner of how this function is implemented can be explained as follows. In the first embodiments, loads at the differential output ports HOT and HOC of the variable gain circuit 3 correspond to two circuits, namely the peak detection circuit 10 and the average value detection/output amplitude setting circuit 11 connected in parallel with it. Since these two circuits are loads, even if transistors each having the minimum size permitted for a manufacturing process are used as the transistors Q1 and Q2 of the input unit of the peak detection circuit 10 and as the transistors Q4 and Q5 of the input unit of the average value detection/output amplitude setting circuit 11, the variable gain circuit 3 drives loads corresponding to two transistors per output port.

In contrast to this, this embodiment can reduce the loads driven by the variable gain circuit 3 to one transistor per output port by inserting the buffer circuit 13. That is, using transistors with the minimum size for the transistors Q7 and Q8 of the input unit of the buffer circuit 13 can reduce the loads driven by the variable gain circuit 3 to about ½ those in the first embodiment. The embodiment reduces the loads driven by the variable gain circuit 3, especially the capacitive loads, and hence can ensure a large band on the high-frequency side of the variable gain circuit 3.

Even additionally arranging the buffer circuit 13 does not change the function of the automatic gain control circuit 5b, i.e., the function of generating and outputting a gain control signal to the variable gain circuit 3 so as to match the output amplitude with the amplitude set by the automatic gain control circuit 5b while monitoring the output amplitude of the variable gain circuit 3. This is because, although the buffer circuit 13 corrects a peak voltage Vpk detected by the peak detection circuit 10 and an average value voltage Vav detected by the average value detection/output amplitude setting circuit 11, a desired output amplitude can be obtained at the output port of the variable gain circuit 3 by setting an output amplitude set value set by the average value detection/output amplitude setting circuit 11 in consideration of the degrees of correction by the buffer circuit 13.

In addition, this embodiment can implement "a reduction in the temperature dependence of the output amplitude value of the variable gain circuit 3" which is the effect obtained in the first embodiment. This is because the effect "a reduction in the temperature dependence of the output amplitude value of the variable gain circuit 3" is based on the transistor-level arrangement of the peak detection circuit 10 and average value detection/output amplitude setting circuit 11, and the embodiment maintains the transistor-level arrangement.

Figure 3A:
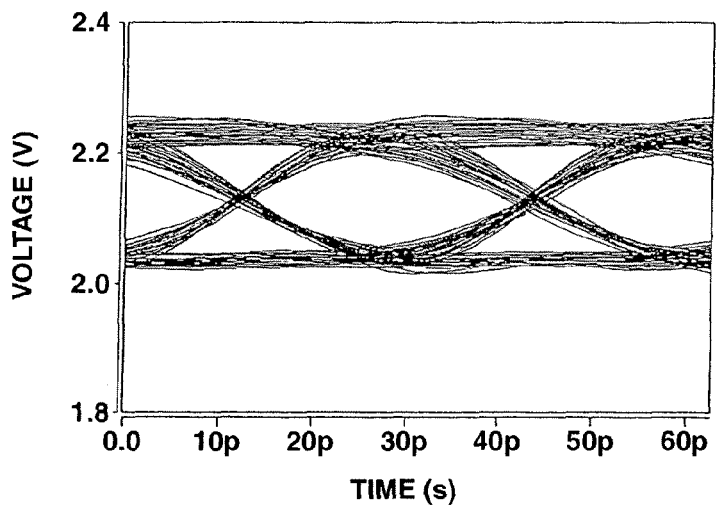
FIGS. 3A to 3C are charts showing simulation results on the temperature dependence of the output amplitude of a variable gain circuit in the second embodiment of the present invention.
Figure 3B:
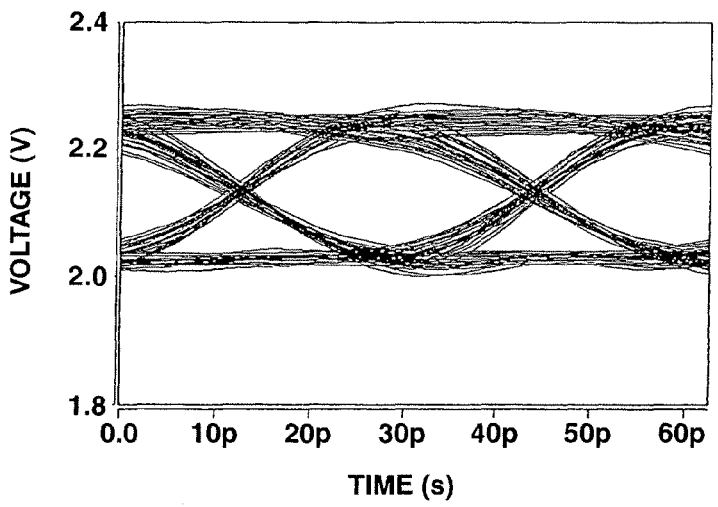
Figure 3C:
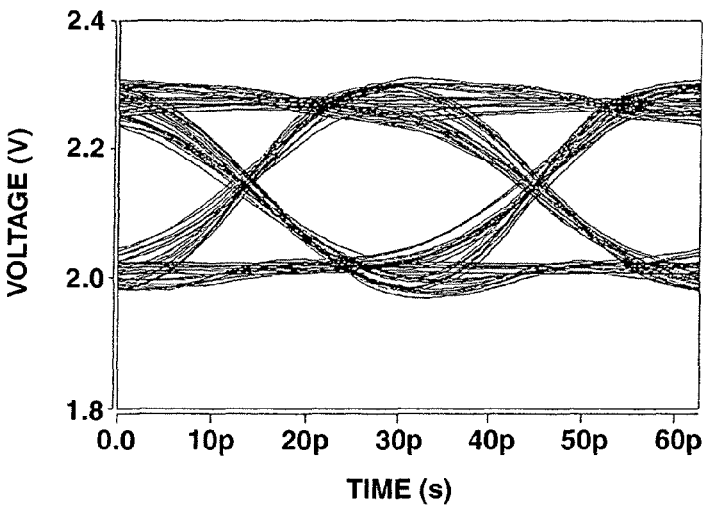

FIGS. 3A to 3C show simulation results on the temperature dependence of the output amplitude of the variable gain circuit 3 in this embodiment. FIGS. 3A, 3B, and 3C respectively show output waveforms at the output port HOT of the variable gain circuit 3 under the conditions of ambient temperatures of −5° C., +25° C., and +100° C. In each simulation, a pseudo random signal of about 180 mVpp 32 Gbps is input to each of the input ports HIT and HIC of the variable gain circuit 3 under each temperature condition. The output amplitude of the variable gain circuit 3 was 242 mVpp at −5° C., 273 mVpp at +25° C., and 342 mVpp at +100° C. As described above, the embodiment can suppress changes in the output amplitude of the variable gain circuit 3 to about 100 mVpp with respect to temperature changes of −5° C. to 100° C.

Although the arrangement of the Gilbert-cell type variable gain circuit shown in FIG. 5 is exemplified as the arrangement of the variable gain circuit 3, the present invention is not limited to this and can be applied to other types of variable gain circuits.

Terminals (input and output terminals) may be formed at the input and output ports of the peak detection circuit 10, average value detection/output amplitude setting circuit 11, voltage detection/setting circuit 111, and buffer circuit 13.

In the above embodiment, the number of base-emitter junctions of the transistors on the path from the input ports 10i1 and 10i2 to the output port 10o in the peak detection circuit 10 is equal to those on the path from the input ports 11i1 and 11i2 to the output port 11o in the average value detection/output amplitude setting circuit 11. For this reason, when the high gain amplifier 12 generates a gain control signal from the difference between the output voltage of the peak detection circuit 10 and the output voltage of the average value detection/output amplitude setting circuit 11, this embodiment eliminates the influence of the base-emitter voltage of the transistors of the peak detection circuit 10 on a gain control signal and the influence of the base-emitter voltage of the average value detection/output amplitude setting circuit 11 on the gain control signal. This will reduce the temperature dependence of the gain control signal. This makes it possible to obtain the effect of reducing the temperature dependence of the output amplitude of the variable gain circuit 3.

Furthermore, since the average value detection circuit and the output amplitude setting circuit are integrated, the above embodiment can obtain effects such as a reduction in the number of elements used, a reduction in chip area, and a reduction in power consumption.

In the above embodiment, the resistors R1, R2, and R3 constitute the voltage detection/setting circuit 111 in the average value detection/output amplitude setting circuit 11, and the voltage obtained by adding a voltage with an amplitude ½ a desired output amplitude of the variable gain circuit 3 to the average value voltage of an output signal from the variable gain circuit 3 is set by the voltage division ratios of the resistors R1, R2, and R3. This allows the average value detection circuit to incorporate the output amplitude setting circuit in a small integrated form.

In addition, the above embodiment includes the buffer circuit 13 to reduce the loads driven by the variable gain circuit 3, and can ensure a large band on the high-frequency side of the variable gain circuit 3.

What is claimed is:

1. An automatic gain control circuit comprising:
a peak detection circuit which detects and outputs a peak voltage of an output signal from a variable gain circuit which amplifies a main signal, and includes transistors;
an average value detection/output amplitude setting circuit which detects an average value voltage of an output signal from the variable gain circuit, outputs a voltage obtained by adding a voltage with an amplitude ½ a desired output amplitude of the variable gain circuit to the average value voltage, and includes transistors; and
an amplification circuit which controls a gain of the variable gain circuit by amplifying a difference between an output voltage of the peak detection circuit and an output voltage of the average value detection/output amplitude setting circuit and outputting the amplification result as a gain control signal to the variable gain circuit,
wherein the number of base-emitter junctions of transistors on a path in the peak detection circuit from input ports which receive output signals from the variable gain circuit to an output port which outputs a voltage to the amplification circuit is equal to the number of base-emitter junctions of transistors on a path in the average value detection/output amplitude setting circuit from input ports which receive output signals from the variable gain circuit to an output port which outputs a voltage to the amplification circuit.

2. A circuit according to claim 1, further comprising a positive-phase input port and a reverse-phase input port which receive output signals from the variable gain circuit, wherein the peak detection circuit includes a first transistor having a base serving as a first input port of the peak detection circuit and connected to the positive-phase input port, and a collector receiving a first power supply voltage, a second transistor having a base serving as a second input port of the peak detection circuit and connected to the reverse-phase input port, and a collector receiving the first power supply voltage, a third transistor having a base connected to an emitter of the first transistor and an emitter of the second transistor, a collector receiving the first power supply voltage, and an emitter serving as an output port of the peak detection circuit, a first capacitor having one port connected to an emitter of the first transistor, an emitter of the second transistor, and a base of the third transistor, and the other port receiving a second power supply voltage, and a first current source which supplies a constant current to the third transistor, the average value detection/output amplitude setting circuit includes a voltage detection/setting circuit which adds a voltage with an amplitude ½ a desired output amplitude of the variable gain circuit to an average value voltage of a voltage at the positive-phase input port and a voltage at the reverse-phase input port, a fourth transistor and a fifth transistor having bases connected to an output port of the voltage detection/setting circuit, and collectors receiving the first power supply voltage, a sixth transistor having a base connected to an emitter of the fourth transistor and an emitter of the fifth transistor, a collector receiving the first power supply voltage, and an emitter serving as an output port of the average value detection/output amplitude setting circuit, a second capacitor having one port connected to an output port of the voltage detection/setting circuit, a base of the fourth transistor, and a base of the fifth transistor, and the other port receiving a second power supply voltage, and a second current source which supplies a constant current to the sixth transistor, a size of the first transistor and the second transistor is equal to a size of the fourth transistor and the fifth transistor, a size of the third transistor is equal to a size of the sixth transistor, and a current value of the first current source is equal to a current value of the second current source.

3. A circuit according to claim 2, wherein the voltage detection/setting circuit includes a first resistor having one port serving as an input port of the average value detection/output amplitude setting circuit and connected to the positive-phase input port, a second resistor having one port serving as a second input port of the average value detection/output amplitude setting circuit and connected to the reverse-phase input port, and a third resistor having one port receiving the first power supply voltage, and the other port of the first resistor is connected to the other port of the second resistor and the other port of the third resistor and serves as an output port of the voltage detection/setting circuit.

4. A circuit according to claim 1, further comprising input ports which receive output signals from the variable gain circuit, and a buffer circuit inserted between the input ports and an input port of the peak detection circuit and an input port of the average value detection/output amplitude setting circuit, the buffer circuit including emitter follower circuits having input ports connected to the input ports, and an output circuit having input ports connected to output ports of the emitter follower circuits, and output ports connected to an input port of the peak detection circuit and an input port of the average value detection/output amplitude setting circuit.

* * * * *